United States Patent
Stampfl et al.

(10) Patent No.: US 7,815,835 B2
(45) Date of Patent: Oct. 19, 2010

(54) RAPID PROTOTYPING METHOD AND RADIATION-CURABLE COMPOSITION FOR USE THEREIN

(75) Inventors: Jürgen Stampfl, Vienna (AT); Heinrich Gruber, Vienna (AT); Helga Lichtenegger, Vienna (AT); Robert Liska, Vienna (AT); Robert Inführ, Vienna (AT)

(73) Assignee: Technische Universitat Wien, Vienna (AT)

( * ) Notice: Subject to any disclaimer, the term of this patent is extended or adjusted under 35 U.S.C. 154(b) by 117 days.

(21) Appl. No.: 11/922,747

(22) PCT Filed: Jun. 29, 2006

(86) PCT No.: PCT/AT2006/000271

§ 371 (c)(1), (2), (4) Date: Jan. 23, 2008

(87) PCT Pub. No.: WO2007/002965

PCT Pub. Date: Jan. 11, 2007

(65) Prior Publication Data

US 2009/0224438 A1    Sep. 10, 2009

(30) Foreign Application Priority Data

Jun. 30, 2005    (AT) .............................. A 1106/2005

(51) Int. Cl.
*B29C 33/40*    (2006.01)

(52) U.S. Cl. ....................... 264/221; 264/227; 264/401; 264/425

(58) Field of Classification Search ................. 264/401, 264/425, 227, 221; 430/269; 522/182, 181
See application file for complete search history.

(56) References Cited

U.S. PATENT DOCUMENTS

| 5,616,293 | A * | 4/1997 | Ashtiani-Zarandi et al. | 264/401 |
| 6,316,519 | B1 * | 11/2001 | Berge et al. | 522/182 |
| 6,818,153 | B2 * | 11/2004 | Burnell-Jones | 252/301.36 |
| 2002/0195747 | A1 * | 12/2002 | Hull et al. | 264/401 |
| 2003/0235787 | A1 | 12/2003 | Watts et al. | 430/280 |
| 2009/0224438 | A1 * | 9/2009 | Stampfl et al. | 264/496 |

FOREIGN PATENT DOCUMENTS

| AT | 412 399 B | | 2/2005 |
| JP | 55132041 | * | 3/1980 |

* cited by examiner

*Primary Examiner*—Yogendra N Gupta
*Assistant Examiner*—David N Brown, II
(74) *Attorney, Agent, or Firm*—Drinker Biddle & Reath LLP

(57) ABSTRACT

The invention relates to a method for producing three-dimensional objects, comprising producing a three-dimensional structure by sequential selective curing of layers of a composition curable with visible and/or ultraviolet light into a solid polymeric material by sequential exposure of the individual layers to UV and/or visible light, whereafter a three-dimensional object is produced by use of the three-dimensional structure thus formed, followed by removing the three-dimensional structure from or of the three-dimensional object, characterized in that removing the three-dimensional structure is accomplished by chemically cleaving the polymeric material as well as simultaneously or subsequently dissolving the material in a solvent or mixed solvent and/or melting the material.

17 Claims, No Drawings

RAPID PROTOTYPING METHOD AND RADIATION-CURABLE COMPOSITION FOR USE THEREIN

The invention relates to a molding method, more particularly to a rapid prototyping method using a composition curable with radiation into a solid polymeric material.

BACKGROUND OF THE INVENTION

Formulations curable with visible or ultraviolet light are known from various technological fields, such as coating, printing and electronics. The use of such compositions in molding techniques is also known. In the "shape deposition manufacturing" method (U.S. Pat. No. 6,342,541), for example, casting molds for complex molded parts are produced by means of UV-curable formulations by curing, on a base plate made of wax, a layer of the liquid formulation by means of ultraviolet light, machining this layer and then surrounding it with new wax. This procedure is repeated until the desired wax mold, filled with the cured composition serving as support material, is obtained. Subsequently, the support material is dissolved out by means of an aqueous alkali lye, so that the empty wax mold can be used for further molding processes.

The U.S. Pat. No. 6,375,880 describes similar support materials for a molding method wherein the support material is removed either by dissolving or by melting; however, it does not give any information on the chemical composition of these materials.

A disadvantage of both molding techniques is the requirement of mechanical machining each individual layer after curing, which makes the production of complex molded parts with undercuts difficult or impossible. Furthermore, planning processes for CNC ("computer numerical control") production is rather complicated.

In stereolithography, this is avoided by selective curing (J.-C. André, A. Le Méhaute, and O. De Witt, FR-A-2,567, 668 (1986), A. J. Herbert, *J. Appl. Photo. Eng.* 8(4), 185-188 (1982), C. Hull., U.S. Pat. No. 4,575,330 (1986)). On a building platform, thin resin layers are selectively cured in succession in a resin bath (e.g. by scanning with a UV laser or selective exposure), so that molded parts are obtained without mechanical working steps. Resin formulations based on acrylate or epoxy resins that have been used in such procedures so far, such as those described in the WO 01/12679, result in crosslinked and thus insoluble and non-meltable components, which are as such used as end products, for example as plastic inserts in dental technology.

This involves the disadvantage that the properties of such a component are determined by the composition of the liquid formulation used, which is only variable to a limited extent due to the requirement of being curable with light. The production of molded parts made of other materials requires further steps in which the insoluble and non-meltable component serves as original mold for producing casting molds. In silicone molding, for example, the original mold is embedded in silicone and then mechanically removed from the soft silicone mold thus obtained. Apart from the additional amount of work involved, mechanical removal is only possible with parts without or with only few undercuts, which makes this method unsuitable for the production of complex components.

Another possibility is insert molding, wherein a casting mold of inorganic material is produced by aid of the original mold, followed by removing the original mold by thermal decomposition. This requires not only a considerable amount of energy, but also casting mold materials tolerating temperatures of up to approximately 600° C.

Alternatively, AT-A-412,399 describes photopolymerizable water-soluble compositions that may be cured selectively and result in water-soluble polymers. This permits the production of complex components, even with deep undercuts, without mechanical treatment of the casting molds.

However, these water-soluble materials have a limited range of use. For example, aqueous processing aids cannot be used in such a molding process as they lead to swelling and solubilization of the original mold. Furthermore, swelling of the material may even be caused by air humidity, leading to reduced dimensional accuracy and thus to a deterioration of the exact geometry of molded parts.

Consequently, a number of important materials processed from aqueous formulations are not suitable for this process, e.g. materials from the field of sol-gel chemistry or gel casting. Especially gel casting permits the production of far more complex geometries than conventional methods of ceramic molding. Here, water-soluble molding materials are not suitable since such ceramic components are produced from water-based gels (see F. Costa et al., *Journal of Non-Crystalline Solids* 345-46, 787-789 (2004), V. K. Parashar et al., *Microelectronic Engineering* 67-8, 710-719 (2003), Y. F. Gu et al., *Ceramics International* 25 (8), 705-709 (1999)).

Molding biomaterials for medical applications, e.g. hydrogel materials with complex conduits and networks, or producing framework structures based on biocompatible and biodegradable composites (e.g. aliphatic polyesters based on glycolic acids or lactones; see S. Limpanuphap et al., *Journal of Materials Science-Materials in Medicine* 13(12), 1163-1166 (2002)) is not possible with such water-soluble compositions.

A further disadvantage of water-soluble compositions is the generally low dissolution rate of polymers in water, which often results in delays in the production process of molded parts.

Thus, one object of the invention is to overcome the above disadvantages by improving molding procedures and/or the curable compositions used therein, such as radiation-curable formulations, which may be selectively cured and processed to mechanically stable casting molds for complex components without mechanical treatment. These casting molds should not swell due to existing air humidity and thus permit improved molding accuracy as well as the use of materials processed from aqueous systems. Further objects of the invention are to provide high dissolution rates for the molds in appropriate solvents and quick melting of the molds as well as improved mechanical properties of the molding materials, which results in advantages during production.

DISCLOSURE OF THE INVENTION

In the course of research, we have discovered that the above objects may be achieved, on the one hand, by chemically cleaving the solid polymeric material formed in the rapid prototyping method before or simultaneously with its dissolution in the solvent and/or its melting, and on the other hand, by largely avoiding the presence of water during the process.

Thus, in a first aspect, the invention provides a method for producing three-dimensional objects, wherein a three-dimensional structure is formed by sequential selective curing of layers of a composition curable with visible and/or ultraviolet light into a solid polymeric material by sequential exposure of the individual layers to UV and/or visible light, whereafter a three-dimensional object is produced by use of the three-dimensional structure thus formed, followed by removing the three-dimensional structure from or out of the three-dimensional object. The inventive method is characterized in that removing the three-dimensional structure is accomplished by chemically cleaving the polymeric material and, simultaneously or subsequently, dissolving the material in a solvent or mixed solvent and/or melting the material.

In variations of this method, the three-dimensional structure may, on the one hand, be used as an original mold for producing a casting mold, wherein the three-dimensional structure according to the present invention is introduced into a molding material and/or a molding material is introduced therein, followed by curing to provide the casting mold and removing the original mold by chemically cleaving and dissolving and/or melting the material, whereafter the three-dimensional object is cast in the casting mold and cured. On the other hand, the three-dimensional structure may be directly used as a casting mold in which the three-dimensional object is cast and cured, followed by removing the casting mold by chemically cleaving and dissolving and/or melting the material.

This permits extremely high dissolution or melting rates, respectively, in rapid prototyping methods because the dissolution or melting procedure is supported by a preceding or simultaneous cleavage of the polymeric material, which facilitates solvent attack in the case of dissolution procedures and thus permits a far more efficient, residue-free and, as mentioned above, quicker dissolution and solvation. On the other hand—in the case of melting—a polymeric material being non-meltable in its uncleaved state or only meltable at (far) higher temperatures may, after successful chemical cleavage, be melted quickly and with only little energy input. Preferred embodiments of the invention may involve a combination of both procedures, i.e. dissolving and melting, which results in especially high productivity of the method. Thus, inventive methods may also comprise the use of crosslinked, even highly crosslinked polymeric materials, which has been considered impossible in the field so far, with the proviso that they include cleavable crosslinking sites. By using such crosslinked materials, dimensional accuracy—both of the three-dimensional structures used as molds and of the desired three-dimensional objects produced therewith—may be significantly improved.

If, in addition to or alternatively to melting, a dissolution step is implemented, the solvent may still be water, but in the present invention the solvent is preferably at least one organic solvent, more preferably selected from the group consisting of tetrahydrofuran, dioxane, ethyl acetate, toluene, and mixtures of two or more of these solvents. Even more preferably, the solvent is substantially anhydrous.

By largely avoiding water, the above disadvantages of swelling and solubilization of the molds found in aqueous systems are avoided, so that the molds may for example also be used for producing objects of aqueous formulations, e.g. by using sol-gel methods or gel casting.

Chemical cleavage of the plastic material may be accomplished by means of any reagent that is able to cleave chemical bonds in solid plastics, e.g. also oxidatively by use of oxygen or other, preferably strong, oxidants. According to the invention, however, cleavage is preferably accomplished by use of at least one acid or base, permitting high reaction rates in cleavage processes. The acids or bases used are preferably organic acids and bases, in order to guarantee good solubility in organic solvents and to be able to largely avoid the use of water. More preferably, the bases are selected from the group consisting of butylamine, hexylamine, octylamine, and mixtures of two or more of these bases. The acids are more preferably selected from the group consisting of formic acid, acetic acid, methanesulfonic acid, and mixtures of two or more of these acids.

In a second aspect, the present invention provides a composition curable with visible and/or ultraviolet light into a solid polymeric material containing cleavable bonds, which composition comprises:

a) 20 to 90% by weight of at least one compound of the general formula

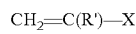

wherein
R' is hydrogen or a $CH_3$ group,
X is $-CO-OR^1$, $-CONR^1R^2$, $-O-CO-R^1$, $-OR^1$, $-C_6H_5$ or $-Z-R-Y$,
wherein $R^1$ and $R^2$ independently represent branched alkyl radicals with 3 to 20 C atoms; 6- to 10-membered cycloaliphatic radicals which may be substituted with one or more linear or branched alkyl groups and which may contain one or more heteroatoms, preferably one, two or three heteroatoms, as ring members; cycloaliphatic radicals with 6 to 20 C atoms, bridged with at least one linear or branched alkylene group; or aromatic radicals with 6 to 30 C atoms,
Z is $-CO-O-$ or $-CO-NH-$,
R is a linear or branched alkylene radical with 1 to 20 C atoms; a cycloaliphatic radical with 6 to 10 C atoms; or an aromatic radical with 6 to 30 C atoms, and
Y is $-NR^1R^2$, $-O-CO-NR^1R^2$, $-NH-CO-OR^1$, $-NH-CO-R^1$, $-O-CO-R^1$, $-CO-OR^1$, $-CO-NHR^1$, or $-OR^1$;

b) 5 to 50% by weight of at least one cleavable crosslinker;

c) 0.01 to 5% by weight of at least one initiator;

d) 0 to 5% by weight of at least one co-initiator; and e) 0 to 70% by weight of one or more additives, selected from the group consisting of fillers, stabilizers, viscosity modifiers, and solvents.

Such radiation-curable compositions and formulations comprise at least one cleavable crosslinker, preferably a crosslinker hydrolyzable with an acid or base, as an essential constituent. After curing, these inventive formulations result in mechanically stable molded parts being insoluble in aqueous media and non-swellable, which may be used as original molds for producing casting molds or directly as casting molds. Subsequently, the same is, as described above, removed from the mold or from the three-dimensional object produced therein by dissolving it in an organic solvent, preferably containing organic, acidic or basic constituents, and/or by melting it. Despite the crosslinked structure, the use of special solvent mixtures involves considerably higher dissolution rates than in the case of non-crosslinked or water-soluble casting molds, even without simultaneous melting procedures.

In preferred embodiments, in constituent a), X is $-CO-OR^1$ or $-CONR^1R^2$, wherein $R^1$ and $R^2$ independently represent branched alkyl radicals with 3 to 10 C atoms, 6- to 10-membered cycloaliphatic radicals which may contain one or more heteroatoms, preferably one or two heteroatoms, as ring members, cycloaliphatic radicals with 6 to 16 C atoms, bridged with at least one linear or branched alkylene group, or $-C_6H_5$. Especially preferably, constituent a) is selected from the group consisting of isobutyl methacrylate, 2-ethylhexyl acrylate, cyclohexyl acrylate, isobornyl acrylate, diisobutylacrylamide, cyclohexylacrylamide, isobornylacrylamide, N-acrylpiperidine and N-methyl-N-cyclohexylacrylamide. Use of such compounds as constituent a) leads to especially good results. For example, using branched monomers results in considerably better mechanical properties of the cured polymeric materials, which is advantageous in the molding process. Dibutyl acrylamide homopolymers, for example, have a shore hardness of approximately 23, while diisobutylacrylamide homopolymers provide a shore hardness of 73.

The at least one cleavable or hydrolyzable crosslinker is thus preferably selected from methacrylic anhydride, bis(methacryloyloxy)dimethylsilane, bis(methacryloyloxy)tetramethyldisiloxane and dimethylsilylene-bis(oxyethylene methacrylate).

Preferably, the composition is curable into a solid polymeric material which is soluble in organic solvents even without previous chemical cleavage, so as to achieve especially high dissolution rates and to allow the addition of polymers of the monomers listed under a), i.e. without the cleavable crosslinker, as fillers to the crosslinked polymers, as will be described in more detail below. In particular, it may be cured into a acid- or base-cleavable polymeric material, so that it may also be used in preferred embodiments of the method according to the first aspect of the invention for producing three-dimensional structures and objects.

Furthermore, the composition is preferably curable to a polymeric material that, optionally after chemically cleaving at least one bond of the at least one cleavable crosslinker, is meltable, so that it may—alternatively or additionally to dissolving it in an organic solvent—be removed by means of a melting procedure, which, as mentioned above, permits especially quick removal of the material in a method according to the first aspect of the present invention.

DETAILED DESCRIPTION OF THE INVENTION

The compounds listed under a) are cured by exposure to UV or visible light. According to the invention, either pure monomers or mixtures may be used. Furthermore, macromomoners are suitable, which may be produced from said compounds by generally known methods. A preferable characteristic of the invention is the solubility of the polymeric materials produced from these monomers, especially in anhydrous solvents. The disclosure of AT-A-412,399 does comprise several similar monomers, e.g. (meth)acrylamides substituted in a similar way, but according to the teachings therein these must inescapably result in water-soluble polymers, which is not only not preferred according to the present invention, but preferably even to be avoided in order to avoid the problems related to swelling.

There are consistencies in the definitions of $R^1$ and $R^2$ between AT-A-412,399 and the present invention, which, however, are only formal in nature. According to AT-A-412,399, $R^1$ and $R^2$ are each hydrogen or "alkylene groups with 1 to 6 carbon atoms," while herein they represent "branched alkyl radicals with 1 to 6 carbon atoms" or "6- to 10-membered cycloaliphatic radicals." Those skilled in the art, who have read AT-A-412,399 and are confronted with the task to synthesize a water-soluble polymer from the compositions disclosed therein, will hardly select branched, longer-chain representatives of the option "alkyl groups with 1 to 6 carbon atoms", or cyclohexyl radicals, but would rather select linear, short-chain alkyl radicals to optimize water solubility. They might even automatically interpret this option as "linear alkyl groups with 1 to 6 carbon atoms."

In contrast, herein the alkyl groups for $R^1$ and $R^2$ are to be selected so as to provide a polymer soluble in organic solvents, which should in addition have improved mechanical properties, which is why, according to the invention, branched radicals with 3 to 20 carbon atoms or cycloaliphatic radicals with 6 to 10 ring members are used. As mentioned above, branched alkyl chains, for example, lead to a significantly higher shore hardness of the polymers than unbranched radicals of the same chain length.

By analogy, a similar principle applies to cyclic radicals, which may be seen as ring-closed branched radicals. Thus, the consistencies "branched alkyl radicals with 3 to 6 carbon atoms" and "6-membered cycloaliphatic radicals" represent a specific selection of the range known from prior art, which provides the compositions of the present invention with new effects that have not been recognized or that were even undesired by the inventors of AT-A-412,399.

According to the present invention, the crosslinkers listed under b) are di- or multi-functional polymerizable compounds, wherein the polymerizable radicals are bound via easily cleavable or hydrolyzable groups, such as anhydride, ester or silyl groups. In contrast to AT-A-412,399, the hydrolyzable crosslinkers are an essential characteristic of the inventive composition because the crosslinking process during polymerization results in mechanically stable molds with high dimensional accuracy, which do not swell in water when aqueous formulations are used for casting the desired three-dimensional objects.

AT-A-412,399 also mentions a monomer that is disclosed herein as cleavable cross-linker according to the invention, i.e. methacrylic anhydride. Therein, however, it is the only difunctional monomer. Furthermore, the mechanism of the present invention, which is based on chemically cleaving the cleavable crosslinkers and simultaneously or subsequently dissolving and/or melting the polymeric material, was not known to the inventors of AT-A-412,399. On the contrary, crosslinked polymers were undesirable because of their generally low dissolution rate, so that the methacrylic anhydride mentioned therein as (co)monomer is to be regarded as accidental anticipation, and its use in the compositions of the present invention is once again to be regarded as a selection invention.

The initiators listed under c) are photoinitiators known from radiation curing technologies such as benzophenone, thioxanthone, benzoins, benzilketals, hydroxyalkylphenones, aminoalkylphenones, acylphosphinoxides, titanocenes, ferrocenes, dye/co-initiator systems, 1,2-diketones, such as camphorquinone or benzil, ketocoumarine or phenylglyoxylates.

In the case of type II photoinitiators, the composition further contains a portion (>0% by weight) of a co-initiator listed under d), for example tertiary aliphatic and/or aromatic amines, arylsulfinates, enolates, thioureas or barbituric acid derivatives.

The additives listed under e) are, for example, fillers for adjusting the viscosity of the liquid starting mixture or for improving the mechanical stability and/or meltability of the cured polymeric materials. Here, oligomers and polymers, such as poly(propylene oxide), poly(vinyl acetate) or polymers of the monomers listed under a), may be used. Derivatives based on cellulose, such as cellulose acetate or cellulose acetobutyrate, are also suitable.

The radiation-curable composition may also contain dispersed inorganic fillers, such as silica, fused silica, alumina, ceramics or quartz, the grain size of which may vary between 0.01 and 100 μm.

Finally, the composition may also contain additives, such as solvents, polymerization inhibitors, sensitizers, dispersants, etc.

Generally, all constituents from a) to e) have to be balanced such that the effects of the invention, especially the high dissolution rate of the solid polymeric material produced therefrom in organic solvents or its good meltability, optionally after chemical cleavage, are not affected. In special cases, however, where the dissolution is to take place not too quickly, the dissolution rate and/or the meltability of a relatively weakly crosslinked polymer may deliberately be reduced by selecting appropriate additives. Those skilled in the art can easily adjust and adapt the system according to the particular circumstances.

Generally, the following constituents are preferred according to the present invention:

- monomers such as isobutyl methacrylate, 2-ethylhexyl acrylate, cyclohexyl acrylate, isobornyl acrylate, diisobutylacrylamide, diisopropylmethacrylamide, N-methyl-N-cyclohexylacrylamide, N-(1,1,3,5-tetramethyl)octylacrylamide, cyclohexylacrylamide, isobornylacrylamide, N-acrylpiperidine;

- cleavable crosslinkers such as methacrylic anhydride, 2-methacryloyloxydodecanoic anhydride, 16-methacryloyloxyhexadecanoic anhydride, silyl (meth)acrylates, e.g. bis(methacryloyloxy)dimethylsilane, bis(methacryloyloxy)tetramethyldisiloxane (see EP 624,827 A1), dimethylsilylene-bis(oxyethylene acrylate), dimethylsilylene-bis(oxyethylene methacrylate) or tetra(methacryloyloxy)silane, boric acid esters, e.g. allyl borate, tris(2-methacryloyloxyethyl)borate, tris(2-methacryloyl)borate, tris(N-(2-hydroxyethyl)acrylamide)borate (see U.S. Pat. No. 3,743,686), as well as oxidatively cleavable compounds, such as N,N'-bis(acryloyl)cystamine, 2-butene-1,4-di(meth)-acrylate; as well as sorbite di(meth)acrylate.

- photoinitiators such as camphorquinone, acylphosphinoxides and titanocenes;

- co-initiators based on tertiary amines, such as ethyl dimethylaminobenzoate, dimethylaniline, triethanolamine, methyl diethanolamine;

- fillers such as cellulose acetobutyrate, poly(methyl methacrylate) or poly-styrene;

- additives such as hydrochinone monomethyl ether and anthraquinone-based sensitizers.

Especially preferred according to the invention are compositions consisting of:

40-90% of a mixture of the monomers diisobutylacrylamide, isobornyl acrylate, cyclohexyl acrylate, N-methyl-N-cyclohexylacrylamide, isobornylacrylamide;

5-25% of methacrylic anhydride or dimethylsilylene-bis(oxyethylene acrylate) as the crosslinker;

1-5% of the photoinitiator Irgacure 819 (Ciba); and 0-40% of cellulose acetobutyrate as a filler.

The specified amounts of monomers, initiators, co-initiators and other additives are mixed, and the liquid mixture is used as a bath in a rapid prototyping set-up for producing three-dimensional objects, as, for example, in the device described in WO 01/12679. Here, a 2D section of the desired component is produced by selective exposure on a building platform. Depending on the composition of the photocurable mixture and the exposure time, curing depths of 1 to 100 μm are achieved. By lowering the building platform, the next layer is formed on the cured first 2D section with renewed selective exposure. The finished object is thus obtained by lowering the platform step-by-step and repeating the photocuring step.

Said object may then be used as an original mold for producing a mold, for example by embedding in wax or silicone molding material. After curing the wax, the material in the interior is dissolved out, according to the invention by use of organic solvents, e.g. THF, dioxane, ethyl acetate or toluene, in combination with organic bases, such as n-butylamine, hexylamine or octylamine, which do not attack the wax. Alternatively or additionally, the material may be melted out if it has a lower melting point than the silicone material.

The empty mold thus obtained may then be used for producing objects of any organic or inorganic material or composite material, for example thermoplastic or thermosetting, i.e. crosslinked, polymers, ceramic components by gel casting ceramics (see J. Stampfl et al., *Materials Science and Engineering A* 334(1-2), 187-192 (2002), A. C. Young et al., *J. Am. Ceram. Soc.* 74(3), 612-618 (1991)), etc.

Alternatively, the inventive composition may be used directly for producing casting molds. Here, selective exposure of the individual layers is controlled so as to obtain a hollow body of the cured material, which is then used as a casting mold. The mold is filled with a liquid resin mixture—e.g. epoxy resin, unsaturated polyester resin, acrylate resin—, which is then cured in the mold. Subsequently, the surrounding mold is dissolved and/or molten, wherein, in the case of dissolution, common organic solvents may be used in combination with organic bases that will not attack the component present in the casting mold. The use of the inventive compositions for producing casting molds is especially advantageous when the component produced therewith is insoluble and/or non-meltable without chemical cleavage, for example when producing components consisting of crosslinked polymers.

In specific embodiments, the inventive composition may be used both for producing a soluble original mold and for producing the molds produced therewith, so that the inventive cleaving and dissolving and/or melting process may be used twice in one method for producing three-dimensional objects. This may, for example, be achieved by using a polymeric material cleavable with acid for the original mold and a material cleavable with base for the actual mold produced therefrom, or vice versa, and/or by using two polymeric materials that are both soluble in different solvents and/or by guaranteeing that one of the materials has a significantly lower melting temperature than the other.

One major advantage of the inventive composition is that most polymers dissolve much faster in organic solvents than in water. Surprisingly, we found out that the use of cleavable or hydrolyzable crosslinkers does not only improve dimensional accuracy, but also accelerates the dissolution process. For this purpose, it is often required to add bases, e.g. butylamine, hexylamine or octylamine, or organic acids, e.g. formic acid, acetic acid or methanesulfonic acid, to common organic solvents. This leads to a considerable advantage in the production of molded parts compared to the water-soluble compositions disclosed in AT-A-412,399.

The following examples illustrate inventive compositions that may be used in rapid prototyping methods as original molds or molding materials for the production of casting molds. The comparative examples, some of which are known from AT-A-412.399, show water-soluble formulations, the solubility and water absorption of which are compared to those of the inventive formulations (Table 1). For determining solubility, a specimen with (10×5×4 mm) is agitated in a corresponding solvent. Quantification is achieved by indicating the time required for total dissolution (rounded to nearest 5 min).

EXAMPLES

|  |  | % by weight |
|---|---|---|
| Example 1 | | |
| monomer | diisobutylacrylamide | 87 |
| crosslinker | methacrylic anhydride | 10 |
| photoinitiator | Irgacure 819 | 3 |
| Example 2 | | |
| monomer | diisobutylacrylamide | 87 |
| crosslinker | bis(methacryloyloxy)dimethylsilane | 10 |
| photoinitiator | Irgacure 819 | 3 |
| Example 3 | | |
| monomer | diisobutylacrylamide | 86 |
| crosslinker | methacrylic anhydride | 10 |
| photoinitiator | camphorquinone | 2 |
| co-initiator | ethyl dimethylaminobenzoate | 2 |
| Example 4 | | |
| monomer | diisobutylacrylamide | 86 |
| crosslinker | bis(methacryloyloxy)dimethylsilane | 10 |
| photoinitiator | camphorquinone | 2 |
| co-initiator | ethyl dimethylaminobenzoate | 2 |
| Example 5 | | |
| monomer | diisobutylacrylamide | 71 |
| crosslinker | methacrylic anhydride | 20 |
| photoinitiator | Irgacure 819 | 3 |
| filler | cellulose acetate butyrate | 6 |
| Example 6 | | |
| monomer | diisobutylacrylamide | 71 |
| crosslinker | bis(methacryloyloxy)dimethylsilane | 20 |
| photoinitiator | Irgacure 819 | 3 |
| filler | cellulose acetate butyrate | 6 |
| Example 7 | | |
| monomer | isobornyl acrylate | 80 |
| crosslinker | methacrylic anhydride | 17 |
| photoinitiator | Irgacure 819 | 3 |
| Example 8 | | |
| monomer | isobornyl acrylate | 80 |
| crosslinker | bis(methacryloyloxy)dimethylsilane | 17 |
| photoinitiator | Irgacure 819 | 3 |
| Example 9 | | |
| monomers | cyclohexyl acrylate | 60 |
|  | diisobutylacrylamide | 12 |
| crosslinker | methacrylic anhydride | 10 |
| photoinitiator | Irgacure 819 | 3 |
| filler | cellulose acetate butyrate | 15 |
| Example 10 | | |
| monomers | cyclohexyl acrylate | 60 |
|  | diisobutylacrylamide | 12 |
| crosslinker | bis(methacryloyloxy)dimethylsilane | 10 |
| photoinitiator | Irgacure 819 | 3 |
| filler | cellulose acetate butyrate | 15 |
| Comparative example 1 (CE1) | | |
| monomer | acrylic acid | 97 |
| photoinitiator | Irgacure 819 | 3 |
| Comparative example 2 (CE2) | | |
| monomers | acrylic acid | 80 |
|  | 2-dimethylaminoethyl acrylate | 17 |
| photoinitiator | Irgacure 819 | 3 |
| Comparative example 3 (CE3) | | |
| monomers | acrylic acid | 60 |
|  | 2-dimethylaminoethyl acrylate | 17 |
| photoinitiator | Irgacure 819 | 3 |
| filler | poly(vinyl alcohol) | 20 |
| Comparative example 4 (CE4) | | |
| monomers | diisobutylacrylamide | 80 |
|  | isobornyl acrylate | 17 |
| photoinitiator | Irgacure 819 | 3 |

TABLE 1

| Example | Weight increase after storage under standard atmosphere, 24 h | Solubility |
|---|---|---|
| CE1 | 4% | 360 min [1] |
| CE2 | 5% | 270 min [1] |
| CE3 | 10% | 240 min [1] |
| CE4 | 0.3% | 85 min [2] |
| 1 | 0.1% | 30 min [3] |
| 2 | <0.1% | 25 min [3] |
| 3 | 0.1% | 30 min [3] |
| 4 | <0.1% | 25 min [3] |
| 5 | 0.1% | 25 min [3] |
| 6 | <0.1% | 20 min [3] |
| 7 | 0.1% | 30 min [3] |
| 8 | <0.1% | 25 min [3] |
| 9 | 0.2% | 40 min [2] |
| 10 | 0.1% | 30 min [2] |

[1] in 1N NaOH
[2] in THF
[3] in THF/butylamine (1:1)

As is clearly shown in Table 1, the specimens produced from the inventive compositions show far less swelling (on average by a factor of 40) with air humidity and dissolve quicker in an organic solvent by a factor of 10 than those produced from compositions according to the state of the art. By adding an organic base, the dissolution rate may be accelerated by approximately 25-30%.

A comparison of comparative example 4 and the examples being embodiments of the invention, especially examples 1, 2, 7 and 8, where the same monomers are used as in CE4, but with the addition of the inventive crosslinkers, shows that the water absorption capacity achieved in CE4 is of the same order, but dissolution still takes three times as long as in embodiments of the present invention.

Furthermore, a comparison of the example pairs 1/2, 3/4, 5/6, 7/8 and 9/10, which only differ in the crosslinkers used, shows that the use of more hydrophobic bis-(methyloxyloxy) dimethylsilane—as compared to methacrylic anhydride—as crosslinker leads to even lower water absorption. Moreover, easy cleavability of the silanol-ester bond accelerates dissolution by further 20-25%.

The invention claimed is:

1. A method for producing three-dimensional objects, comprising:
produce a three-dimensional structure by sequential selective curing of layers of a composition curable with visible and/or ultraviolet light into a solid polymeric material by sequential exposure of the individual layers of said polymeric material to UV and/or visible light,
producing a three-dimensional object on or inside the three-dimensional structure thus formed, and
removing the three-dimensional structure from on or inside the three-dimensional object, by chemically cleaving the polymeric material and, simultaneously or subsequently, dissolving the polymeric material in a solvent or mixed solvent, and/or melting the material.

2. The method of claim 1, wherein the three-dimensional structure forms an original mold wherein or whereon a casting mold representing the three-dimensional object is molded.

3. The method of claim 1, wherein the three-dimensional structure forms a casting mold wherein or whereon the three-dimensional object is molded.

4. The method of claim 1, wherein the polymeric material is dissolved in a solvent, and the solvent is selected from the group consisting of tetrahydrofuran, dioxane, ethyl acetate, toluene, and mixtures of two or more thereof.

5. The method of claim 1, wherein the polymeric material is dissolved in a solvent and the solvent is a substantially anhydrous solvent.

6. The method of claim 1, wherein cleaving the polymeric material is accomplished by use of at least one acid or base.

7. The method of claim 6, wherein the base is selected from the group consisting of butylamine, hexylamine, octylamine, and mixtures of two or more thereof.

8. The method of claim 6, wherein the acid is selected from the group consisting of formic acid, acetic acid, methanesulfonic acid, and mixtures of two or more thereof.

9. The method of claim 1, wherein the composition which is curable with visible and/or ultraviolet light into a solid polymeric material comprises (a) 20 to 90% by weight of at least one compound of the general formula $$CH_2=C(R')-X$$

wherein

R' is hydrogen or a $CH_3$ group,

X is $-CO-OR^1$, $-CONR^1R^2$, $-O-CO-R^1$, $-OR^1$, $-C_6H_5$ or $-Z-R-Y$, wherein $R^1$ and $R^2$ independently represent branched alkyl radicals containing 3 to 20 carbon atoms; 6- to 10-membered cycloaliphatic radicals which may be optionally substituted with one or more linear or branched alkyl groups and which may optionally contain one or more heteroatoms, as ring members; cycloaliphatic radicals containing 6 to 20 carbon atoms, bridged with at least one linear or branched alkylene group; or aromatic radicals containing 6 to 30 carbon atoms, Z is $-CO-O-$ or $-CO-NH-$, R is a linear or branched alkylene radical containing 1 to 20 carbon atoms; a cycloaliphatic radical containing 6 to 10 carbon atoms; or an aromatic radical containing 6 to 30 carbon atoms, and Y is $-NR^1R^2$, $-O-CO-NR^1R^2$, $-NH-CO-OR^1$, $-NH-CO-R^1$, $-O-CO-R^1$, $-CO-OR^1$, $-CO-NHR^1$ or $-OR^1$;

(b) 5 to 50% by weight of at least one cleavable crosslinker;

(c) 0.01 to 5% by weight of at least one initiator;

(d) 0 to 5% by weight of at least one co-initiator; and (e) 0 to 70% by weight of one or more additives, said additives being selected from the group consisting of fillers, stabilizers, viscosity modifiers, and solvents.

10. The method of claim 9, wherein, in constituent (a), X is $-CO-OR^1$ or $-CONR^1R^2$, wherein $R^1$ and $R^2$ independently represent branched alkyl radicals containing 3 to 10 carbon atoms; 6- to 10-membered cycloaliphatic radicals which may optionally contain one or more heteroatoms, as ring members; cycloaliphatic radicals containing 6 to 16 carbon atoms, bridged with at least one linear or branched alkylene group; or $-C_6H_5$.

11. The method of claim 9 wherein constituent (a) is selected from the group consisting of isobutyl methacrylate, 2-ethylhexylacrylate, cyclohexyl acrylate, isobornyl acrylate, diisobutylacrylamide, cyclohexylacrylamide, isobornylacrylamide, N-acrylpiperidine, and N-methyl-N-cyclohexylacrylamide.

12. The method of claim 9, wherein at least one cleavable crosslinker is selected from the group consisting of methacrylic anhydride, bis(methacryloyloxy)dimethylsilane, bis(methacryloyloxy)tetramethyldisiloxane, and dimethylsilylen-bis(oxyethylene methacrylate).

13. The method of claim 9, wherein the composition is curable into a solid polymeric material soluble in organic solvents.

14. The method of claim 9, wherein the composition is curable into an acid- or base-cleavable polymeric material.

15. The method of claim 9, wherein the composition is curable to a polymeric material that, optionally after chemically cleaving at least one bond of the at least one cleavable crosslinker, is meltable.

16. The method according to claim 9, wherein the 6- to 10-membered cycloaliphatic radical comprising $R^1$ or $R^2$ contains one, two or three heteroatoms.

17. The method according to claim 10, wherein the 6- to 10-membered cycloaliphatic radical comprising $R^1$ or $R^2$ contains one or two heteroatoms.

* * * * *